United States Patent [19]

Rutenbar et al.

[11] Patent Number: 4,541,114
[45] Date of Patent: Sep. 10, 1985

[54] ROUTING TECHNIQUES USING SERIAL NEIGHBORHOOD IMAGE ANALYZING SYSTEM

[75] Inventors: Robin A. Rutenbar; Robert M. Lougheed, both of Ann Arbor, Mich.

[73] Assignee: Research Environmental/Institute of Michigan, Ann Arbor, Mich.

[21] Appl. No.: 491,945

[22] Filed: May 5, 1983

[51] Int. Cl.³ .............................................. G06K 9/36
[52] U.S. Cl. ...................................... 382/8; 364/491; 382/27; 382/41; 382/49
[58] Field of Search ........................ 382/8, 27, 41, 49; 358/106, 107, 101; 364/488–491

[56] References Cited

U.S. PATENT DOCUMENTS

3,603,771 9/1971 Isett et al. ............................ 364/491
3,681,782 8/1972 Scanlon ............................... 364/491
4,495,559 1/1985 Gelatt, Jr. et al. .................. 364/491

Primary Examiner—Leo H. Boudreau
Attorney, Agent, or Firm—Krass & Young

[57] ABSTRACT

Serial neighborhood image processing stages, preferably arranged in a pipeline, are used to layout conductor paths on circuits such as printed circuit boards and integrated circuit devices. Pixels associated with areas on the circuit corresponding with source, target, free and blocked cells are encoded with preselected pixel values. The circuit image is then transmitted to the neighborhood transformation stages in a raster scan line format. The stages analyze the pixel values in each neighborhood and transform free cells into digital representations of conductor paths between the source and target.

9 Claims, 8 Drawing Figures

Fig-1

PROCESSING STAGE STORAGE SECTION

IMAGE ARRAY

ROUTING TECHNIQUES USING SERIAL NEIGHBORHOOD IMAGE ANALYZING SYSTEM

DESCRIPTION

1. Technical Field

This invention relates to the use of data processing equipment for automatically laying out conductor patterns on circuits such as printed circuit boards and integrated circuit devices. More particularly, it involves image analyzer systems utilizing serial neighborhood transformation stages to perform such processes.

2. Background Art

One of the most important steps in the design of printed circuit boards or integrated circuit chips is the layout or routing of conductor paths or wires. In many of the state of the art devices there is an extremely large number of conductor paths that must be routed from one point to another. The complexity of this task has been lessened somewhat through the use of computer aided design (CAD) systems. CAD systems generally employ a processor unit adapted to generate an image, generally a grid pattern, on a display corresponding to the geometry of the device on which the conductors are to be located. Working from a net list of network components and connections that must be placed on the device, the user locates each component in the desired position on the displayed image. Those locations on the image corresponding to beginning or source points and ending or target points for the conductor paths between the components are also designated and labeled.

The next general step is for the user to enter a "wire ordering" step in which certain preselected criteria defines the order in which the wires are to be connected. For example, it may be desired to have the shortest length wires connected first, moving to progressively longer length wires during the routing process. In effect, the wire ordering step generates a list of pairs of source and target cells arranged so that their respective wires will be layed out in sequential order, the first wire taking preference over the second wire and so forth until all of the wires have been routed.

After the placement and wire ordering steps have been performed, the last and perhaps the most crucial step is the layout of the conductor paths. This is referred to as "final routing" and, historically, there have been three types of general techniques for electronically performing this process; grid expansion, channel routing and linear expansion. An excellent discussion of the three techniques is presented in Soukup, "Circuit Layout", Proceedings of the IEEE, Vol. 69, No. 10, October 1981.

Grid expansion is one of the most commonly used approaches for wire routing. The well-known Lee's algorithm and various adaptations thereof have been performed by general purpose computers and two dimensional parallel array image processors. In an array processing system there exists one processor for each cell in the cell-space, where a cell is considered as a square on a routing grid, a bit in a bit-map, or, as used herein, a picture element in an image. These processors operate in lock step and communicate with their nearest neighbors to perform neighborhood operations. Although such architectures can be very fast, they have drawbacks in light of the limitations of present fabrication and packaging technology.

An introductory survey of Lee routing techniques is found in chapter 6 of Design Automation of Digital Systems, Vol. 1, Ed. Breuer, (1973). Briefly, this technique finds the shortest path between the source and target cells or pixels in a rectangular grid containing cells which are blocked, i.e. not available for conductor path travel. Beginning with one of the end points, an expanding wavefront of progressively increasing numerical values for the cells are generated until the other end point is reached. The shortest path is then retraced by following those cells labeled with progressively decreasing numerical values. Thus, the conductor path is defined between the source and target areas on the grid.

When routing techniques of this type are performed on a general purpose computer the expanding wave front can generate a very complicated data structure that requires a large amount of storage. Speed improvements can be achieved by accessing merely the boundary cells during the expansion step. However, processing time remains a very real concern. Higher speeds could be achieved by using cellular array processing noted above where each processor would contain information about one or more cells in the rectangular grid. Such an array system could operate simultaneously on all cells within the grid thereby decreasing processing time. However, most sophisticated printed circuit boards or integrated circuit devices require such precise tolerances that thousands of cells are often necessary to provide sufficient image resolution. Thus, either a corresponding large number of individual processors or a smaller number of processors with considerable memory in each processor must be provided. The cost of such a parallel array system may be economically prohibitive to many users.

The practical shortcomings of these parallel array image processors led the Environmental Research Institute of Michigan to develop an alternative image processing system as disclosed in U.S. Pat. No. 4,167,728; U.S. Pat. No. 4,322,716; and U.S. Ser. No. 178,312, filed Aug. 15, 1980, now U.S. Pat. No. 4,395,698, all of which are hereby incorporated by reference. Briefly, these patents disclose a serial pipeline of neighborhood processing stages, with a common clock, in which each stage in the pipeline performs a single neighborhood transformation of an entire image. Images are entered into the pipeline as a steam of multiple-bit pixels in sequential raster scan line format and progress through the pipeline of processing stages at a constant rate. Following the initial delay to fill the pipeline, processed images are produced at the same rate as they are entered. Neighborhood extraction means are provided to hold nine neighborhood pixels which constitute a 3×3 window. Neighborhood transformation logic forms a preprogrammed transformation of the center pixel based on the values of the center and its eight neighbors. The transformed output of one stage is coupled to the input of the next stage in the pipeline.

The present invention is directed to utilizing the above-mentioned serial neighborhood image processing system to perform automatic routing or layout of conductor patterns on circuits such as printed circuit boards and integrated circuit devices.

SUMMARY OF THE INVENTION

Pursuant to the present invention, an image representing a pre-labeled rectangular grid is fed in a raster scan line format to an input of a serial neighborhood processing stage. The stage operates to sequentially examine each neighborhood in the image consisting of a center pixel and its surrounding pixels in the image. Based on the values of the pixels in the neighborhood the center pixel is selectively transformed to a value associated with an arrow pointing toward the source or beginning point of the conductor path. Preferably, there are a plurality of stages arranged in a pipeline such that the output of preceding stages are coupled to the inputs of successive stages in the pipeline. These neighborhood transformations are carried out in the stages until the target pixel is also transformed to a value associated with an arrow pointing back towards the source. Then, the pixel values are analyzed to trace back along the source-pointing arrows from the target to the source to define the new conductor path. Lastly, a clean-up step is performed wherein extraneously labeled cells not on the new path are returned to their original values representing free cells whereas the new conductor path is labeled as an obstacle for subsequently generated conductor paths.

BRIEF DESCRIPTION OF THE DRAWINGS

The various advantages to the present invention will become apparent upon reading the following specification and by reference to the drawings in which:

FIG. 5 (A-D) illustrates rectangular image grids during various steps in the routing process performed by the stages.

DESCRIPTION OF THE PREFERRED EMBODIMENT

Figure 1:
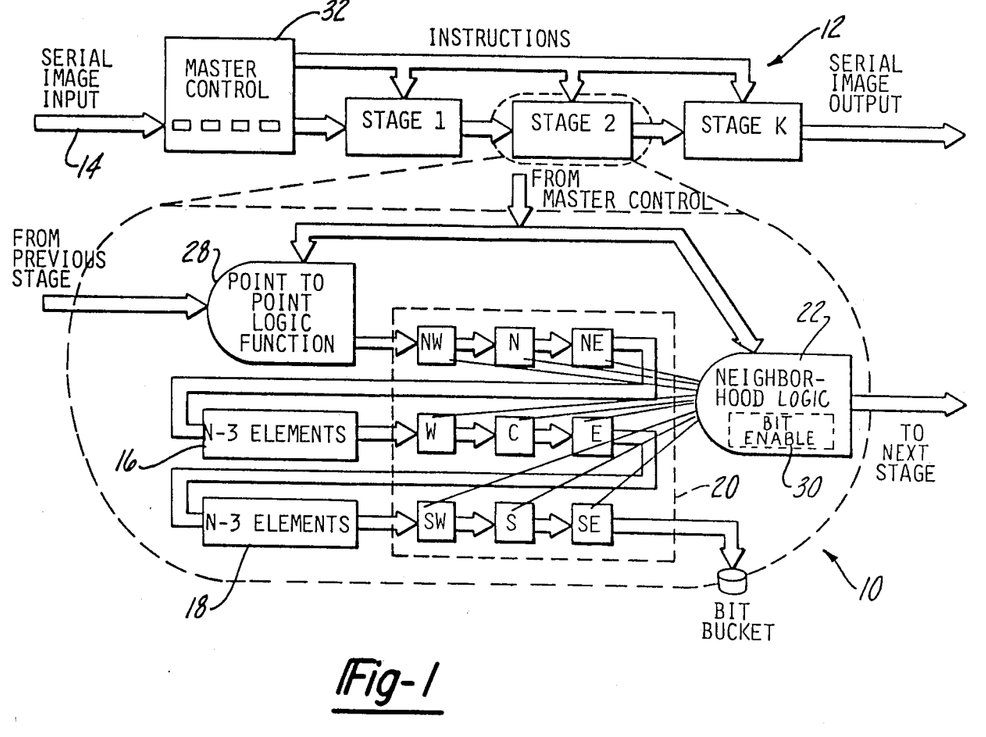
FIG. 1 is a block diagram which schematically illustrates a pipeline of serial neighborhood transformation stages.

FIG. 1 illustrates, in simplified form, a serial neighborhood processing system 10 that may be utilized in performing the routing techniques pursuant to the present invention. As will be explained later herein, a grid or matrix of multi-bit cells or pixels form an image of the device onto which the conductor patterns are to be layed out. The original image data can be provided by a variety of means including state of the art computer aided design (CAD) equipment and the like. If desired, the image data may be temporarily stored in an external memory such as a disk from which data can be read out in a raster scan line format by conventional methods.

In the preferred embodiment, the system 10 consists of a pipeline 12 of substantially identical serial neighborhood transformation stages. Stages are connected to a common clock and each stage in the pipeline performs a single neighborhood transformation of an entire image matrix. Data is entered into the pipeline 12 as a serial stream of eight bit pixels in sequential line scanned format and progress through the pipeline of processing stages at a constant rate. Following the initial latency to fill the pipeline, image matrix cells are analyzed at the same rate as they are entered. Memory devices within each stage are provided to hold two contiguous scan lines. In the embodiment shown in FIG. 1, shift registers 16 and 18 are employed as line delay buffers which cooperate with the window registers to perform this function. Preferably, however, the window registers are sequentially loaded from a random access memory in each stage as disclosed in U.S. Ser. No. 178,313, filed Aug. 15, 1980, to McCubbrey et al, now U.S. Pat. No. 4,395,700, which is hereby incorporated by reference, as well as in the aforementioned Ser. No. 178,312, now U.S. Pat. No. 4,395,698.

An array 20 of neighborhood window registers holds nine neighborhood pixels which constitute a 3×3 window. The output of the window register array 20 is coupled to a neighborhood logic transformation module 22. Module 22 performs a preprogrammed transformation of the center pixel based on the values of the center pixel and its eight neighbors. Neighborhood logic transformations are computed within the data transfer clock period, allowing the output of a stage to appear at the same rate as its input. At each discrete time interval a new pixel is clocked into the stage and the old pixels are shifted one position.

Figure 2:
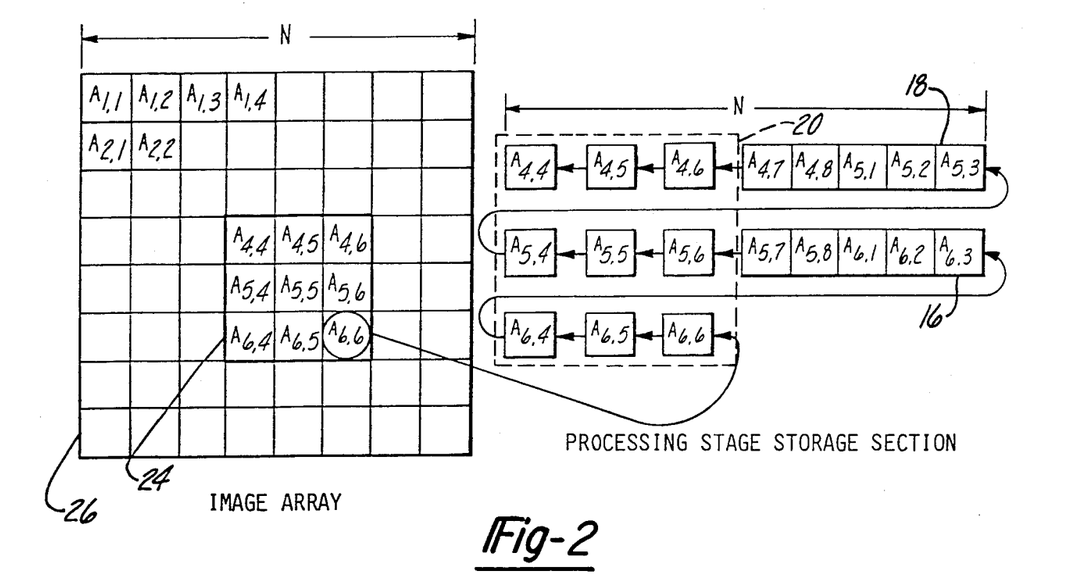
FIG. 2 schematically represents a neighborhood window in an image.
Figure 3:
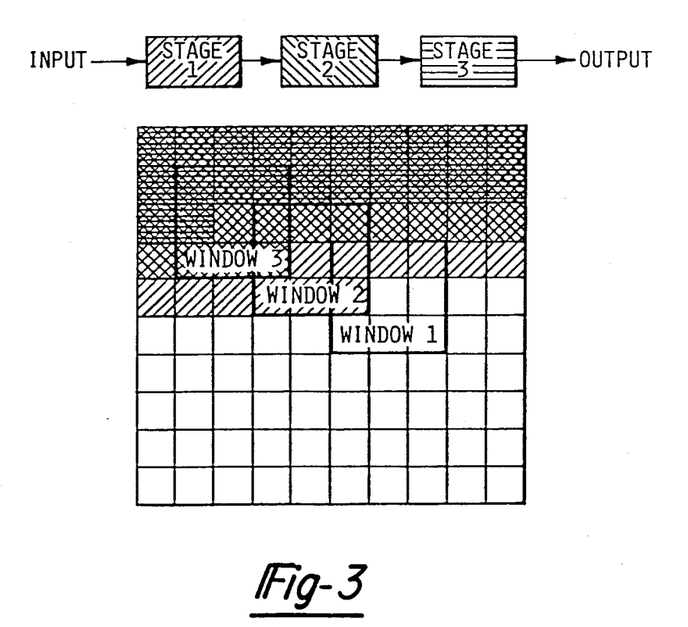
FIG. 3 schematically represents the neighborhood window relationships during execution of transformations in three successive stages in the pipeline.

To visualize the transformation process, imagine a 3×3 window 24 moving across an image matrix 26 as shown in FIG. 2. The window register array 20 is shown in FIG. 2 after the pixel $A_{6,6}$ has been read. The neighborhood transformation module 22 computes the transformed value of the pixel in the center window register as a function of its value and the value of its surrounding neighbors. The transformed output value of the center pixel is then output from the stage and connected to the input of the next stage. From this example, it can be realized that the latency of a stage is equal to N+2 time steps, N being the line length. FIG. 3 illustrates a series of three 3×3 stage windows following each other across the image matrix, each of the three stages processing the previous stage's output.

Referring back to FIG. 1, each stage further includes point-by-point logic circuitry 28 for performing operations which do not depend upon the values of neighboring pixels. For example, point-by-point logic circuitry 28 may perform such things as scaling, ANDing or ORing together selected bits in the pixels, or other Boolean functions. In such manner, the point-by-point logic circuitry 28 may simplify the design of the module 22.

Each stage in the pipeline 12 further includes bit level enable circuitry 30 within module 22 for selecting one or more of the pixel bits for analysis in a given stage. The non-selected bits pass through the stage unmodified. The programming of each stage, including the selection of the particular bits to be enabled, is accomplished by way of a master controller 32 communicating with each stage. The details of a satisfactory bit level enable circuit are disclosed in U.S. Pat. No. 4,301,443, while the programming of the pipeline stages is preferably carried out by the techniques taught in said application Ser. No. 178,312.

Figure 4:
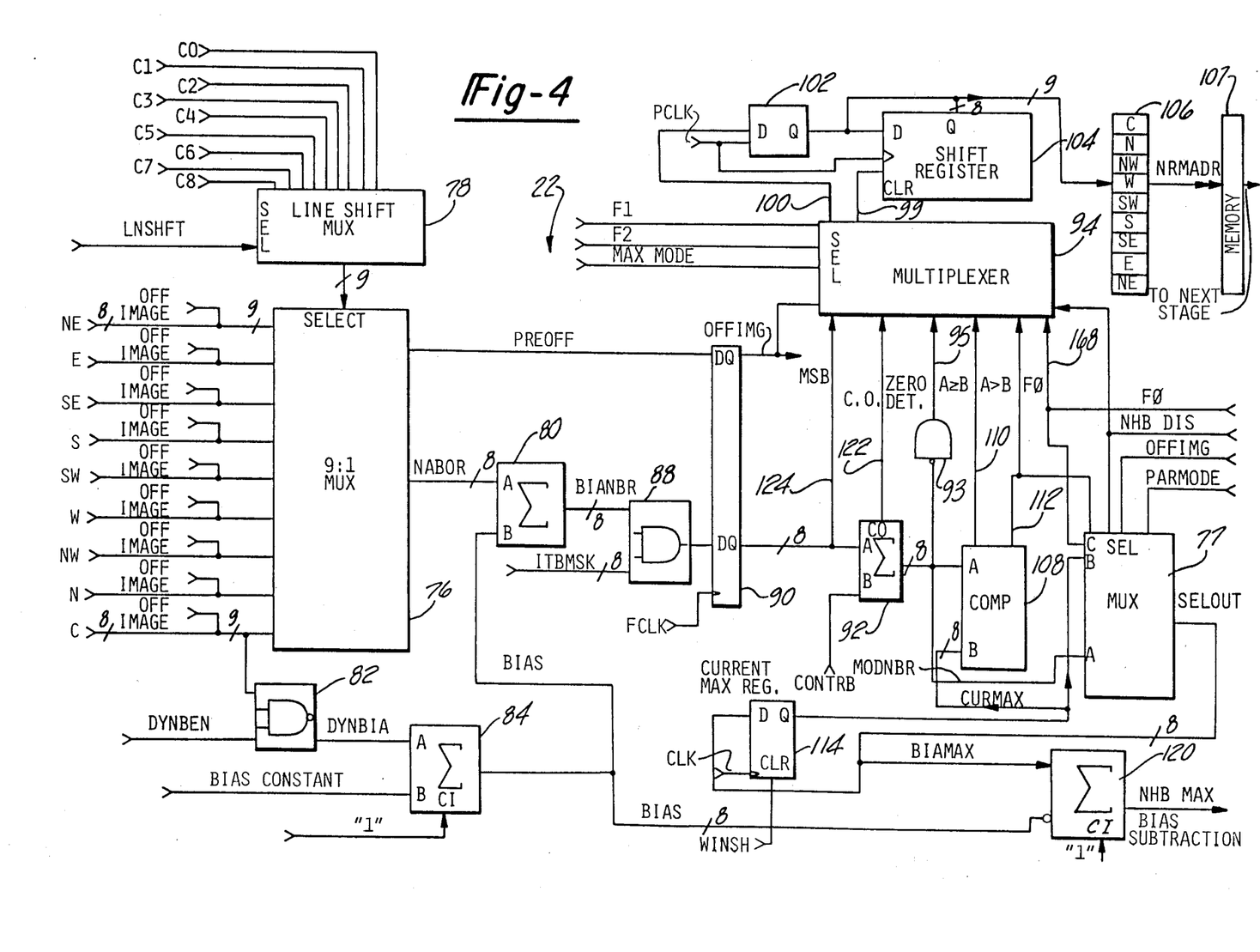
FIG. 4 is a schematic diagram of the neighborhood analysis logic circuitry employed by a stage.

FIG. 4 shows the details of the neighborhood logic module 22. Again, the circuitry is more fully described in the above referenced patent application and consequently, only those details as are necessary to the understanding of the present invention will be described. Briefly, the pixel values contained in the neighborhood windows 20 are sequentially coupled to the input of adder 92 via multiplexer 76. The pixel selection is controlled by multiplexer 78 which provides coded signals to the select input of multiplexer 76.

Each selected pixel value is coupled through adder 80 to an input of an eight element AND gate 88. The other inputs to gate 88 are derived from internal control registers which provide mask signals to selectively disable a particular bit or bits from being considered in calculating the transformation. There is also a programmable output bit mask which may be used to prevent particular bits from being changed during the transformation process. Combined use of the input bit mask and output bit mask can selectively disable bits from undergoing any transformation and, thus, those bits will pass to the next stage unmodified. This so-called bit level enabling feature is disclosed in U.S. Pat. No. 4,301,443 which is hereby incorporated by reference.

The output of AND gate 88 is coupled to a buffer register 90. The output of register 90 is coupled to input A of adder 92. The other input B to adder 92 is a contribution value CONTRB derived from the preprogrammed internal registers of the stage. The particular contribution value will vary depending upon the analysis desired of the particular stage. For example, if one is interested in all of the pixel values in the window having a value of 5, the contribution value will be chosen to be the 2's complement of 5; namely, −5. Therefore, all pixel values having a pixel value of 5 will produce a zero or logical low level at the output of 92 when added with the −5 contribution value. This zero level is detected by an eight low-true-input AND gate 93 which supplies a logical 1 (true) level over line 95 to one input of multiplexer 94. Multiplexer 94 is a modified 7:2 multiplexer which selectively couples up to two of its seven inputs to its two outputs 99 and 100.

In this mode of operation, multiplexer 94 couples the input line 95 to output line 100. Output line 100 is coupled to an input of flip flop 102. The Q output of flip flop 102 is coupled to the D input of an eight bit serial-in-parallel-out shift register 104. Thus, shift register 104 will be loaded with a logical true level if the pixel value is equal to and opposite from the contribution value CONTRB and will otherwise be loaded with a logical false level. This process occurs for all of the pixels in the neighborhood window. After the last pixel bit in the neighborhood window has been analyzed, the contents of shift register 104 and flip flop 102 is simultaneously transferred into a nine bit buffer 106. Each bit position in buffer 106 corresponds with a particular pixel in the neighborhood window. The contents of buffer 106 is used as an address to a memory 107 which generates the ultimate transformation output to the next stage in the pipeline. It will be appreciated that the various locations in memory 107 will be preprogrammed with transformation values that will be addressed depending upon the analysis carried out by the neighborhood transformation logic 22.

The neighborhood analysis logic circuitry 22 also permits the user to determine whether the pixel values are above or below a given value. For example, if it is desirable to determine which pixels in the neighborhood contain values above the value of 6, the 2's complement of the binary value 6 is applied as a contribution value to the B input of adder 92. All pixel values having a value greater than or equal to 6 will generate a carry out (CO) output on adder output line 122. In this analysis mode, the multiplexer 94 output line 100 is coupled to input line 122. Accordingly, output buffer 106 will contain a logical 1 level in each pixel bit position which is greater than or equal to the value of interest.

OPERATION

As discussed in the Background Art portion of this application a CAD system may be employed to generate a skeleton circuit image of the device onto which the conductor paths are to be layed out. Typically, the skeleton image will contain information relating to the placement of components on the circuit as well as the source and target points for conductor paths between the various components. Thus, this skeleton image contains sufficient information to define the location of the source and target for each conductor path as well as those areas on the circuit which are free (i.e., available for conductor path travel) and those which are blocked (i.e., not available for conductor path travel). Typically, the blocked areas correspond to borders of the device and those areas onto which the various components will be located. This skeleton image data may be temporarily stored on a magnetic disk memory.

In order to perform the routing sequence pursuant to the present invention, the skeleton image data is transferred over line 14 to the input of master controller 32. Master controller 32 may be a general purpose computer of any suitable design. Controller 32 operates to label each pixel in the skeleton circuit image as source, target, free or blocked cells by assigning preselected values to the pixels. In this particular example, the pixels associated with the free cells are assigned the value of 0; pixels associated with blocked cells, the value of 1; pixels associated with source cells, the value of 2; and pixels associated with the target cells, the value of 128. In FIG. 5, the following labeling scheme or alphabet is utilized:

| | |
|---|---|
| S, T | source and target cells |
| O, # | free and blocked cells |
| ←, ↑, ↓, → | arrows on wavefront pointing to source |
| T←,T↑,T↓,T→ | target labeled by wavefront (path found) |
| ST | source labeled during target traceback |

After the stages have been programmed, as will be explained, the labeled skeleton image is transmitted serially in raster scan line format from controller 32 to the input of the first stage in the pipeline 12.

The routing of a single wire takes three steps: grow out, retrace, and clean up. The grow out step is performed by carrying out a series of neighborhood transformations which selectively change the value of the center pixel as a function of a set-membership test on the surrounding pixels of the neighborhood. In FIG. 1 the center pixel in the neighborhood window register 20 is labeled with a C while the neighbors are labeled according to the points of a compass. As the skeleton image is shifted through the neighborhood window registers 20, each pixel eventually becomes the center pixel in the neighborhood. Each stage in the pipeline is programmed to analyze the values of the pixels in each neighborhood. If the center pixel is not associated with a free or target cell it is not transformed and passes along unmodified to the next stage in the pipeline. However, if the value of the center pixel corresponds with a free or target cell then it is transformed to another value associated with an arrow pointing back to the source. This is accomplished by determining whether the north, west, east or south pixel neighbor has a value associated with the source cell or a previously generated directional arrow.

The following Table I sets forth the algorithm for performing this function:

TABLE I $\Lambda = \{\leftarrow, \uparrow, \downarrow, \rightarrow, S\}$

GROW OUT:
1. IF center $\epsilon\{O,T\}$
   THEN BEGIN
2. IF n $\epsilon\Lambda$
   THEN attach $\uparrow$ to center
3. ELSE IF w $\epsilon\Lambda$
   THEN attach $\leftarrow$ to center
4. ELSE IF e$\epsilon\Lambda$
   THEN attach $\rightarrow$ to center
5. ELSE IF s$\epsilon\Lambda$
   THEN attach $\downarrow$ to center
   END In the preferred embodiment, step 1 of the grow out step is performed by the neighborhood logic 22 of FIG. 8 in the following manner. The higher order bits are masked so that pixels associated with the target (having a value of 128) are treated as having a value of 0, the same as free cells. In this example, the input mask applied to an input of adder 88 operates to enable only the three least significant bits of the eight bit pixel value.

Multiplexer 76 selects the center pixel which is coupled to the A input of adder 92. The stage is programmed with the contribution value of 0. As a result, the output of adder 92 will be 0 only if the center pixel is a free or target cell. This condition is detected by zero detector line 95 whose value is eventually loaded into the bit position in buffer 106 associated with the center pixel. If the state of the center pixel bit position in buffer 106 is not associated with a free or target cell, then the value of the center pixel is not transformed and passes to the input of the next stage unmodified. However, if the center pixel is a free or target cell the analysis of the neighborhood pixels (steps 2-5 of Table I) may result in transforming the center pixel value into a value associated with an arrow pointing back towards the source.

In order to determine whether the north, west, east or south neighboring pixels belong to the set $\Lambda$, the neighborhood transformation logic 22 performs the following operation. Multiplexer 76 selects the pixel associated with the north neighbor and couples it to the A input of adder 92. When the neighboring pixels are selected, the stage is programmed to provide a contribution value of $-2$ and to select the carry out line 122 to provide information to buffer 106. It will be remembered that the pixels associated with the source have been labeled with the value of 2. The pixels to be directional arrows will be assigned values of 3, 4, 5 or 6 depending upon which direction they are pointing. As a consequence, by testing each neighbor to determine whether its value is greater than or equal to 2, it is possible to determine whether it is a source or an arrow. Each of the north, south, east and west neighboring pixels are tested in the same manner. The diagonally positioned neighbors are ignored. After each neighborhood has been analyzed the derived information is shifted into buffer 106. Each bit position in the nine bit word stored therein contains information associated with the test performed on each pixel within the neighborhood. As noted before, if the bit associated with the center pixel does not test out as a free or target cell then no transformation will occur. Otherwise, the center pixel value will change to represent an arrow if the test on the other neighboring pixels are valid. For example, if the bit in buffer 106 associated with the north pixel neighbor is true indicating that the northerly neighbor is either a previously generated arrow or the source, then the center pixel will be transformed to a value of 3 indicating a northerly pointed arrow. If the northerly neighbor fails to pass the test but the westerly neighbor does, the center cell will be transformed to a value of 4 associated with a westerly pointing arrow. In other words, when more than one neighbor passes the setmembership test, the transformation chooses directions in the order $\uparrow, \leftarrow, \rightarrow, \downarrow$. This order is arbitrary and may be changed without affecting this invention.

Figure 5A:
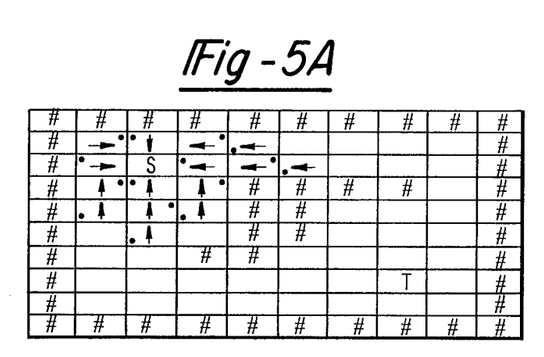

FIG. 5A illustrates the routing process during a portion of the grow out step. The first stage in the pipeline will transform those cells surrounding the source, noted with the dot in the upper left-hand corner. For example, when the pixel associated with the dotted box in the second row is the center cell in the neighborhood, it initially would have a value associated with a free cell but would be transformed into a value associated with a southerly pointing arrow because its south neighbor contained the source. Similar transformations are performed on the other nondiagonal adjacent cells surrounding the source. The other cells in the image matrix would not be transformed. Thus, the transformed image supplied to the second stage of the pipeline would be the same as the original skeleton image except for the transformed cells around the source. The second stage in the pipeline, however, will transform those cells noted with a dot in the upper right-hand corner to values associated with arrows pointing back to the source. The third stage would transform those cells noted with the dot in the lower left-hand corner.

Figure 5B:
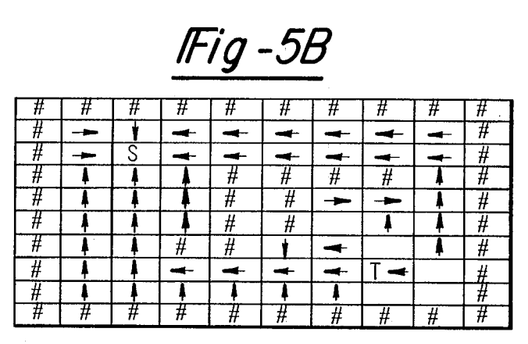

This process would continue until the target cell is labeled with an arrow as shown in FIG. 5B. In this example, the target cell will have a value of 128 plus a value associated with one of the arrow pointers, i.e. 3, 4, 5 or 6. It will be remembered that the high order bits have been masked so that the logical one level in the second most significant bit position associated with the binary value of 128 has not been changed during the grow out step.

Figure 5C:
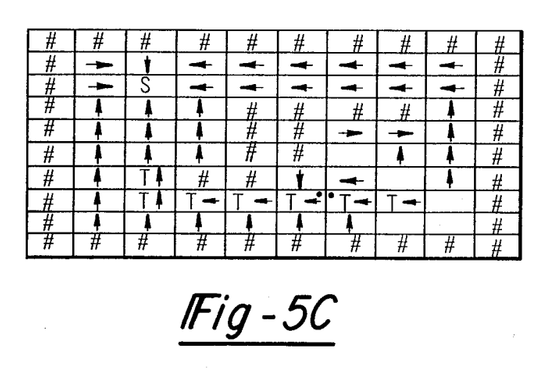

The next step is to trace back from the target along the arrows pointing back to the source until the source is reached. During the trace back procedure as shown in FIG. 5C each cell along the path is transformed into values defining the conductor path between the source and target. In this particular example, the stages in the pipeline are programmed to determine whether any of the neighbors have values associated with targeted arrows pointing toward center pixel arrow in the neighborhood window 20. If so, that center cell is transformed or labeled with a T. In other words, a binary value of 128 is added to the original pixel value of that cell. With reference to FIG. 8 this is accomplished by generating an appropriate contribution value and monitoring the zero detect output line 95 for the north, south, east and west neighbors. For example, when the north neighbor is selected by multiplexer 76 the contribution value applied to the B input of adder 92 is set to be $-(128$ plus 6) or $-134$, i.e. the two's complement of the target value plus the value associated with a southerly pointing arrow. As a consequence, if the northerly cell has been previously labeled with a T and is pointing to the center cell then the center cell is also labeled with a T. The algorithm for the trace back routine is set forth in the following Table II.

TABLE II

TRACE-BACK:
IF center $\epsilon\Lambda$ AND

TABLE II-continued ((n = T↓)OR(w = T→)OR(e = T←)OR(s = T↑))
THEN attach T to center With reference to FIG. 5C, the first stage in the pipeline performing the trace back step would transform the cell labeled with a dot in the upper left-hand corner because its easterly neighbor has been labeled with a T and an arrow pointing towards the center cell. Consequently, the center cell is also labeled with a T. During the pass through the next stage the cell including a dot in the upper right-hand corner will meet the test of Table II and thus it will be labeled with a T. This trace back step continues until the source cell is also labeled with a T. At this point all of the pixels defining a conductor path having the shortest available length between the source and target will contain a logical 1 in the most significant bit position associated with the T label. Represented in binary notation, each cell along the defined path will contain the value of 10000XXX.

It should be noted that in some instances it may be preferable to use a general purpose computer such as Master Controller 32 to perform the trace back step. However, for relatively small images or memory-limited host machines it may be advantageous to use the serial neighborhood pipeline 12 in the manner described above.

Figure 5D:
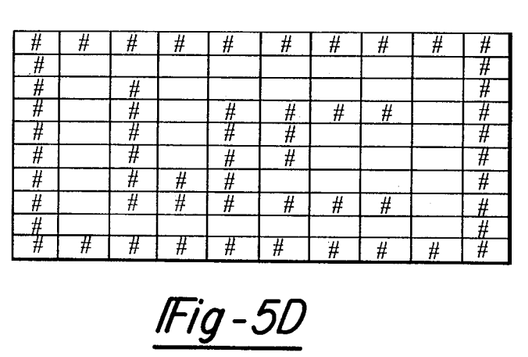

The last step is the clean up step which removes extraneously labeled cells in the image and labels the newly found circuit path as blocked cells for routing other wires. In the preferred embodiment the clean up step may be performed by the point-to-point logic 28 of one of the stages. If a pixel has been labeled with a T (i.e. having a logical 1 level in the most significant bit position) its value is changed to represent a blocked cell or a value of 1. Those pixels already having a value of 1 remain unchanged. Finally, those pixels having values of 3, 4, 5 or 6 (non T-labeled arrows) are changed to a value of zero, representing free cells. FIG. 5D represents the image after the clean up step has been completed.

Other wires can be similarly routed by labeling the transformed image matrix with a new source and target. To route multiple point nets, each pixel on the new path could be relabeled as a source and a new target introduced. Then the sequence could be repeated so that the system automatically lays out a branch of the previously routed conductor path to the new target.

Various other advantages of the present invention wil become apparent to those skilled in the art. As noted above, one of the primary features of this invention is that circuit routing can be performed in a relatively economical manner using the serial neighborhood processing system without unduly sacrificing processing time. It is expected that a 100 stage pipeline system is capable of routing a conductor path of a length 700 on a 200×200 grid in about 1.7 seconds. A 200 stage system is expected to reduce the processing time to about 1.1 seconds. However, a one stage system may still advantageously utilize the teachings of this invention. In such case the transformed output of the stage would be recirculated back to its input, with the stage being reprogrammed to perform the grow out, trace back, and clean up steps. Those skilled in the art will appreciate still other advantages and straight forward modifications of this invention without departing from the spirit or scope thereof as defined in the following claims.

We claim:
1. A method of automatically laying out conductor paths between source and target areas on a circuit represented by an image containing pixels having preselected values associated with source, target, free and blocked areas of the circuit, said method comprising:
   (a) feeding the pixels of the image in a serial manner to an input of a neighborhood transformation stage, said stage including neighborhood extraction means for sequentially accessing each neighborhood of pixels in the image, the stage further including neighborhood transformation logic means, operative to selectively provide a transformation output for the stage as a function of the values of a center pixel and its surrounding neighbor pixels in each extracted neighborhood;
   (b) performing a grow out step using the neighborhood transformation logic means to transform free pixels in the image between the source and target to values associated with arrows pointing back towards the source;
   (c) performing a trace back step by changing the arrow pixels between the target and source to given values associated with a conductor path between the target and source; and
   (d) performing a clean up step by changing the conductor path pixels to values associated with blocked areas of the circuit thereby producing an image that may be utilized to lay out other conductors on the circuit.

2. The method of claim 1 wherein the neighborhood transformation logic means in step (b) performs the following sequence of operation:
   (test 1) determining whether the center pixel in each neighborhood has a value associated with a free or target pixel; and
   (test 2) determining whether the neighbor pixels of the center pixel have values associated with source or arrow pixels;
   if tests 1 and 2 are met, the neighborhood transformation logic means operating to generate a transformation output with a value associated with an arrow pointing to the source for that neighborhood and, otherwise, the unchanged value of the center pixel as the transformation output.

3. The method of claim 2 wherein said neighborhood transformation logic means includes adder means for adding together values applied to its inputs, means for sequentially connecting the pixels in each neighborhood to one input of the adder, and means for applying a programmable contribution value to the other input of the adder; and
   wherein step (b) is performed by generating various contribution values, detecting the output of the adder, and generating the transformation output for the stage as a function of the detected output of the adder.

4. The method of claim 3 wherein each pixel is represented by a plurality of bits, the free pixels and target pixels having binary values in which the least significant bit has a logical zero state; and
   wherein (test 1) is performed by masking at least some of the more significant bits, generating a contribution value of zero and determining whether the output of the adder means is zero when the center pixel is applied to the one input of the adder.

5. The method of claim 4 wherein said source and arrow pixels have binary values greater than or equal to 2; and Wherein (test 2) is performed by generating a contribution value of −2 and detecting whether the adder generates a carry out bit when the neighbor pixels are applied to the other adder input.

6. The method of claim 1 wherein said neighborhood transformation logic means performs step (b) by testing each neighborhood in the image and generating a transformation output for the stage as follows:

TABLE I

| $\Lambda = \{\leftarrow, \uparrow, \downarrow, \rightarrow, S\}$ |
|---|
| GROW OUT: |
| 1. IF center $\epsilon\{O,T\}$ THEN BEGIN |
| 2. IF n $\epsilon\Lambda$ THEN attach $\uparrow$ to center |
| 3. ELSE IF w $\epsilon\Lambda$ THEN attach $\leftarrow$ to center |
| 4. ELSE IF e$\epsilon\Lambda$ THEN attach $\rightarrow$ to center |
| 5. ELSE IF s$\epsilon\Lambda$ THEN attach $\downarrow$ to center | where the arrows, S, O, T are preselected pixel values associated with arrow pixels, source pixels, free pixels, and target pixels, respectively; and wherein n, w, e, and s are north, west, east and south neighbor pixels in the extracted neighborhood.

7. The method of claim 1 where in step (b) the target pixel is transformed to a given value including an arrow pixel value pointing back towards the source and wherein step (c) is carried out by the neighborhood transformation logic means of the stage by performing the following tests:

(test 3) determining whether the center pixel in each neighborhood has a vaue associated with an arrow or the source; and (test 4) determining whether any of the neighbor pixels have said given value associated with the target and an arrow pointing towards said center pixel;

if tests 3 and 4 are met, the transformation logic means operating to transform the value of the center pixel to a value asociated with the conductor path between the target and source; and otherwise, using the unchanged value of the center pixel as the transformation output for the stage.

8. The method of claim 7 wherein the conductor path pixel values provided in step (c) all include the same binary logic state in a given bit position; and wherein step (d) changes the values of all pixels whose given bit position contains said state into a value associated with blocked areas of the circuit.

9. The method of claim 6 wherein the neighborhood transformation logic means in step (c) analyzes each neighborhood and generates a transformation output therefore as follows:

TABLE II

| TRACE-BACK: |
|---|
| IF center $\epsilon\Lambda$ AND ((n = T$\downarrow$)OR(w = T$\rightarrow$)OR(e = T$\leftarrow$)OR(s = T$\uparrow$)) THEN attach T to center | where T—arrow is a pixel having a value associated with a portion of the conductor path beginning from the target.

* * * * *

UNITED STATES PATENT AND TRADEMARK OFFICE
CERTIFICATE OF CORRECTION

PATENT NO. : 4,541,114

DATED : September 10, 1985

INVENTOR(S) : Robin A. Rutenbar and Robert M. Lougheed

It is certified that error appears in the above-identified patent and that said Letters Patent are hereby corrected as shown below:

Please delete "Assignee:  Research Environmental/Institute of Michigan"

Please insert --Assignees:  Environmental Research Institute of Michigan and The University of Michigan, both of--

Signed and Sealed this

Fourth Day of February 1986

[SEAL]

Attest:

Attesting Officer

DONALD J. QUIGG

Commissioner of Patents and Trademarks